(12) United States Patent
Narang

(10) Patent No.: US 11,536,792 B2
(45) Date of Patent: Dec. 27, 2022

(54) TEST OF AN EXAMINATION TOOL

(71) Applicant: Applied Materials Israel Ltd., Rehovot (IL)

(72) Inventor: Gagandeep Narang, Bangalore (IN)

(73) Assignee: Applied Materials Israel Ltd., Rehovot (IL)

( * ) Notice: Subject to any disclaimer, the term of this patent is extended or adjusted under 35 U.S.C. 154(b) by 223 days.

(21) Appl. No.: 16/863,932

(22) Filed: Apr. 30, 2020

(65) Prior Publication Data
US 2021/0341559 A1 Nov. 4, 2021

(51) Int. Cl.
*G01R 35/00* (2006.01)
*G01R 31/265* (2006.01)

(52) U.S. Cl.
CPC ......... *G01R 35/00* (2013.01); *G01R 31/2656* (2013.01)

(58) Field of Classification Search
CPC .. G01R 31/2656; G01R 35/00; G01R 31/265; G01M 11/02; G01M 11/0242; G03F 7/706; G03F 7/70591; G03F 7/70358; G03F 7/70483; G03F 7/70258; G03F 7/20; G03F 7/7065; Y10T 428/24802; G01N 21/94; G01N 21/9501
USPC .................................................... 324/750.01
See application file for complete search history.

(56) References Cited

U.S. PATENT DOCUMENTS

| | | | |
|---|---|---|---|
| 6,366,352 B1 | 4/2002 | Goldberg et al. | |
| 6,882,417 B2 | 4/2005 | Goldberg et al. | |
| 2004/0105575 A1* | 6/2004 | Ganz | G01N 35/028 382/128 |
| 2016/0282221 A1* | 9/2016 | Huebel | G03F 7/7085 |
| 2020/0110129 A1* | 4/2020 | Nakamura et al. | G02B 6/32 |

FOREIGN PATENT DOCUMENTS

CN 1598521 A * 3/2005 ............ G01M 11/02

OTHER PUBLICATIONS

Espacenet English translation of Chen et al. CN1598521A Performance detecting device of light-beam scanner (Year: 2005).*

* cited by examiner

*Primary Examiner* — Jermele M Hollington
*Assistant Examiner* — Courtney G McDonnough
(74) *Attorney, Agent, or Firm* — Lowenstein Sandler LLP

(57) ABSTRACT

There is provided a system and a method of testing an optical device in a scanner for scanning a semiconductor specimen, the method comprising controlling, by a processor and memory circuitry (PMC) operatively connected to the scanner, an optical element optically connected to the optical device to deviate an optical path of light transmitted by the optical device so to transmit towards an imaging sensor, thereby enabling acquiring, by the imaging sensor, image data informative of the optical device, wherein in a scanning mode the optical element enables light transmitting from the optical device towards another optical device comprised in the scanner, and processing the acquired image data to obtain results informative of operability of the optical device.

20 Claims, 5 Drawing Sheets

TEST OF AN EXAMINATION TOOL

TECHNICAL FIELD

The presently disclosed subject matter relates, in general, to the field of examination of a specimen, and more specifically, to a test of an examination tool usable for the examination of a specimen.

BACKGROUND

Current demands for high density and performance associated with ultra large scale integration of fabricated devices require submicron features, increased transistor and circuit speeds, and improved reliability. Such demands require formation of device features with high precision and uniformity, which, in turn, necessitates careful monitoring of the fabrication process, including automated examination of the devices while they are still in the form of semiconductor wafers.

Examination processes are used at various steps during semiconductor fabrication to detect and classify defects on specimens. Effectiveness of examination can be increased by automatization of process(es) as, for example, Automatic Defect Classification (ADC), Automatic Defect Review (ADR), etc.

GENERAL DESCRIPTION

In accordance with certain aspects of the presently disclosed subject matter, there is provided a system for scanning a semiconductor specimen, the system comprising a light source producing an illuminating beam, a scanner optically connected to the light source and comprising a plurality of optical devices including a first optical device configured, in a scanning mode, to transmit light along an optical path towards a second optical device, at least one optical element optically connected to the first optical device and capable to deviate an optical path of light transmitted by the first optical device, at least one imaging sensor, at least one light detector configured to detect light resulted from scanning at least part of the semiconductor specimen, a processor and memory circuitry (PMC) operatively connected to the scanner and configured, in a test mode, to control the at least one optical element to deviate the optical path of light transmitted by the first optical device so to transmit along a second optical path comprising the at least one imaging sensor, instead of transmitting towards the second optical device, thereby enabling acquiring, by the at least one imaging sensor, image data informative of the first optical device, and process the acquired image data to obtain results informative of operability of the first optical device.

According to some embodiments, the scanner comprises a plurality of pairs, each pair including an optical device configured, in a scanning mode, to transmit light along an optical path towards another optical device of the scanner, at least one optical element optically connected to the optical device and capable to deviate an optical path of light transmitted by the optical device, wherein the PMC is configured, during test of an optical device of a given pair, to control at least one optical element of the given pair to deviate the optical path of light transmitted by the optical device of the pair so to transmit along a second optical path comprising the at least one imaging sensor, thereby enabling acquiring, by the at least one imaging sensor, image data informative of the optical device of the given pair, process the acquired image data to obtain results informative of operability of the optical device of the given pair.

According to some embodiments, the PMC is configured to, during test of the optical device of the given pair, control, for each of one or more other pairs, one or more optical elements of the other pair, wherein the one or more optical elements of the other pair are located upstream the optical device of the given pair along an optical path of the scanner, to allow transmission of light of an optical device of the other pair along an optical path towards another optical device of the scanner.

According to some embodiments, the optical devices of the scanner comprise at least one of a beam expander, a beam shaper, a beam polarizer, a phase corrector, a beam divider, and a beam collector.

According to some embodiments, the PMC is configured to obtain, for the first optical device, a plurality of image data, or data representative thereof, acquired based on a plurality of tests of the first optical device performed at different periods of time, and output data indicative of operability of the first optical device based on the plurality of image data or data representative thereof.

According to some embodiments, the PMC is configured to predict, based on a plurality of image data acquired during a plurality of tests of the first optical device, or data representative thereof, a life cycle of the first optical device.

According to some embodiments, the PMC is configured to monitor evolution of the plurality of image data, or data representative thereof, over the plurality of different periods of time, and to output data indicative of operability of the first optical device based at least on a matching of the evolution with an operability criterion.

According to some embodiments, the system is configured to, during performing a plurality of tests of the first optical device at a plurality of different periods of time, maintain one or more optical parameters constant for the plurality of tests.

According to some embodiments, the PMC is configured to determine data D informative of grey level based on the image data, and to output data indicative of operability of the first optical device based on $D_{grey}$.

According to some embodiments, the system further comprises an interface configured to output, for each optical device that has been tested, data informative of an operability of the optical device.

In accordance with certain other of the presently disclosed subject matter, there is provided a method of testing an optical device in a scanner for scanning a semiconductor specimen, the method comprising, controlling, by a processor and memory circuitry (PMC) operatively connected to the scanner, an optical element optically connected to the optical device to deviate an optical path of light transmitted by the optical device so to transmit towards an imaging sensor, thereby enabling acquiring, by the imaging sensor, image data informative of the optical device, wherein in a scanning mode the optical element enables light transmitting from the optical device towards another optical device comprised in the scanner, and processing the acquired image data to obtain results informative of operability of the optical device.

According to some embodiments, the scanner comprises a plurality of pairs, each pair including an optical device configured, in a scanning mode, to transmit light along an optical path towards another optical device of the scanner, at least one optical element optically connected to the optical device and capable to deviate an optical path of light transmitted by the optical device, wherein the method comprises, during test of an optical device of a given pair, by the PMC, controlling at least one optical element of the given pair to deviate the optical path of light transmitted by the optical device of the pair so to transmit along a second optical path comprising the at least one imaging sensor, thereby enabling acquiring, by the at least one imaging sensor, image data informative of the optical device of the given pair, and processing the acquired image data to obtain results informative of operability of the optical device of the given pair.

According to some embodiments, the method comprises, by the PMC, during test of the optical device of the given pair, controlling, for each of one or more other pairs, an optical elements of the other pair, located upstream the optical device of the given pair along an optical path of the scanner, to allow transmission of light of an optical device of the other pair along an optical path towards another optical device of the scanner.

According to some embodiments, the method comprises obtaining, for the first optical device, a plurality of image data, or data representative thereof, acquired based on a plurality of tests of the first optical device performed at different periods of time, and outputting data indicative of operability of the first optical device based on the plurality of image data or data representative thereof.

According to some embodiments, the method comprises predicting, based on the plurality of image data acquired during a plurality of tests of the first optical device, or data representative thereof, a life cycle of the first optical device.

According to some embodiments, the method comprises monitoring evolution of the plurality of image data, or data representative thereof, over the plurality of different periods of time, and outputting data indicative of operability of the first optical device based at least on a matching of the evolution with an operability criterion.

According to some embodiments, the method comprises, during performing a plurality of tests of the first optical device at a plurality of different periods of time, maintaining one or more optical parameters constant for the plurality of tests.

According to some embodiments, the method comprises determining data $D_{grey}$ informative of grey level based on the image data, and outputting data indicative of operability of the first optical device based on $D_{grey}$.

According to some embodiments, the method comprises outputting, on an interface, for each optical device that has been tested, data informative of an operability of the optical device.

In accordance with other aspects of the presently disclosed subject matter, there is provided a non-transitory computer readable medium comprising instructions that, when executed by a computer, cause the computer to perform the method above.

According to some embodiments, the proposed solution reduces time and cost required to test an examination tool. In particular, the period of time in which the examination tool is not operative due to its test is reduced, thereby increasing availability rate of the examination tool. According some embodiments, the proposed solution offers an automatic test of an examination tool. According to some embodiments, the proposed solution provides a pinpointed and precise feedback regarding a location of failure in the examination tool. According to some embodiments, the proposed solution generates prediction regarding life cycle of optical devices of the examination tool.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
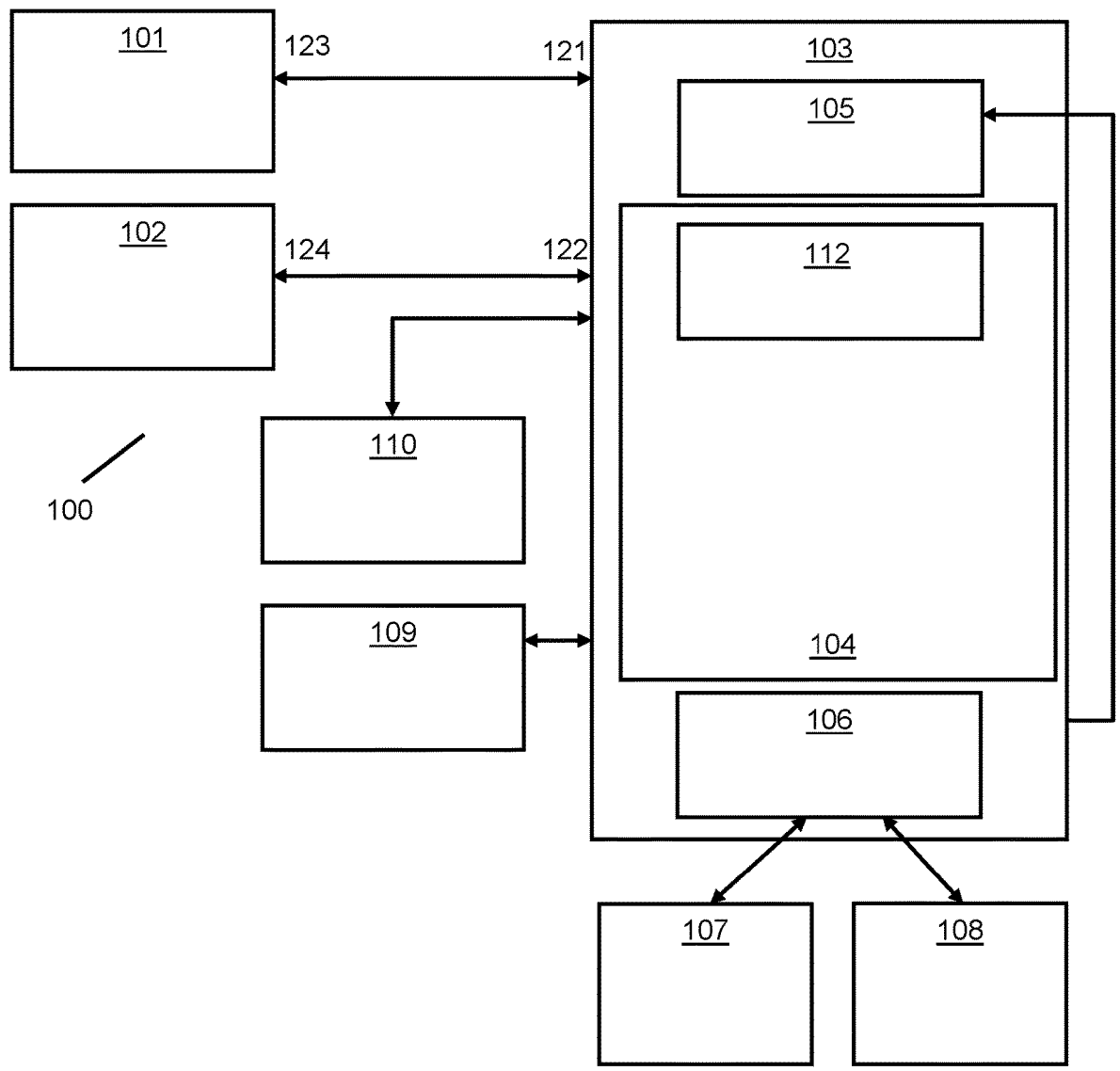
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "obtaining", "selecting", "determining", "generating", "outputting" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the system 103 and respective parts thereof disclosed in the present application.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

By way of non-limiting example, run-time examination can employ a two phase procedure, e.g. inspection of a specimen followed by review of sampled locations of potential defects. During the first phase, the surface of a specimen is inspected at high-speed and relatively low-resolution. In the first phase, a defect map is produced to show suspected locations on the specimen having high probability of a defect. During the second phase at least part of the suspected locations are more thoroughly analyzed with relatively high resolution. In some cases, both phases can be implemented by the same inspection tool, and, in some other cases, these two phases are implemented by different inspection tools.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats such as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter. The examination system 100 illustrated in FIG. 1 can be used for examination of a specimen (e.g. of a wafer and/or parts thereof) as a part of the specimen fabrication process. The illustrated examination system 100 comprises computer-based system 103 capable of automatically determining metrology-related and/or defect-related information using images obtained during specimen fabrication. System 103 can be operatively connected to one or more low-resolution examination tools 101 (e.g. an optical inspection system, low-resolution SEM, etc.) and/or one or more high-resolution examination tools 102 (e.g. a scanning electron microscope (SEM) or Atomic Force Microscopy (AFM)) and/or other examination tools. The examination tools are configured to capture images and/or to review the captured image(s) and/or to enable or provide measurements related to the captured image(s).

System 103 can be further operatively connected to CAD server 110 and data repository 109.

System 103 includes a processor and memory circuitry (PMC) 104 operatively connected to a hardware-based input interface 105 and to a hardware-based output interface 106. PMC 104 is configured to provide all processing necessary for operating the system 103 and includes a processor (not shown separately) and a memory (not shown separately). The processor of PMC 104 can be configured to execute several functional modules in accordance with computer-readable instructions implemented on a non-transitory computer-readable memory comprised in the PMC. Such functional modules are referred to hereinafter as comprised in the PMC. Functional modules comprised in PMC 104 include in particular a deep neural network (DNN) 112.

By way of non-limiting example, the layers of DNN 112 can be organized in accordance with Convolutional Neural Network (CNN) architecture, Recurrent Neural Network architecture, Recursive Neural Networks architecture, Generative Adversarial Network (GAN) architecture, or otherwise. Optionally, at least some of the layers can be organized in a plurality of DNN subnetworks. Each layer of the DNN can include multiple basic computational elements (CE), typically referred to in the art as dimensions, neurons, or nodes.

Generally, computational elements of a given layer can be connected with CEs of a preceding layer and/or a subsequent layer. Each connection between a CE of a preceding layer and a CE of a subsequent layer is associated with a weighting value. A given CE can receive inputs from CEs of a previous layer via the respective connections, each given connection being associated with a weighting value which can be applied to the input of the given connection. The weighting values can determine the relative strength of the connections and thus the relative influence of the respective inputs on the output of the given CE. The given CE can be configured to compute an activation value (e.g. the weighted sum of the inputs) and further derive an output by applying an activation function to the computed activation. The activation function can be, for example, an identity function, a deterministic function (e.g., linear, sigmoid, threshold, or the like), a stochastic function, or other suitable function. The output from the given CE can be transmitted to CEs of a subsequent layer via the respective connections. Likewise, as above, each connection at the output of a CE can be associated with a weighting value which can be applied to the output of the CE prior to being received as an input of a CE of a subsequent layer. Further to the weighting values, there can be threshold values (including limiting functions) associated with the connections and CEs.

The weighting and/or threshold values of DNN 112 can be initially selected prior to training, and can be further iteratively adjusted or modified during training to achieve an optimal set of weighting and/or threshold values in a trained DNN. After each iteration, a difference (also called loss function) can be determined between the actual output produced by DNN 112 and the target output associated with the respective training set of data. The difference can be referred to as an error value. Training can be determined to be complete when a cost or loss function indicative of the error value is less than a predetermined value, or when a limited change in performance between iterations is achieved. Optionally, at least some of the DNN subnetworks (if any) can be trained separately, prior to training the entire DNN.

System 103 is configured to receive, via input interface 105, input data. Input data can include data (and/or derivatives thereof and/or metadata associated therewith) produced by the examination tools (resulting from examination of a specimen) and/or data produced and/or stored in one or more data repositories 109 and/or in CAD server 110 and/or another relevant data depository. It is noted that input data can include images (e.g. captured images, images derived from the captured images, simulated images, synthetic images, etc.) and associated numeric data (e.g. metadata, hand-crafted attributes, etc.). It is further noted that image data can include data related to a layer of interest and/or to one or more other layers of the specimen.

System 103 is further configured to process at least part of the received input data and send, via output interface 106, the results (or part thereof) to a storage system 107, to examination tool(s), to a computer-based graphical user interface (GUI) 108 for rendering the results and/or to external systems (e.g. Yield Management System (YMS) of a FAB). GUI 108 can be further configured to enable user-specified inputs related to operating system 103.

Upon processing the input data (e.g. low-resolution image data and/or high-resolution image data, optionally together with other data as, for example, design data, synthetic data, etc.), system 103 can send the results (e.g. instruction-related data 123 and/or 124) to any of the examination tool(s), store the results (e.g. defect attributes, defect classification, etc.) in storage system 107, render the results via GUI 108 and/or send to an external system (e.g. to YMS).

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in other embodiments at least some examination tools 101 and/or 102, data repositories 109, storage system 107 and/or GUI 108 can be external to the examination system 100 and operate in data communication with system 103 via input interface 105 and output interface 106. System 103 can be implemented as stand-alone computer(s) to be used in conjunction with the examination tools. Alternatively, the respective functions of the system can, at least partly, be integrated with one or more examination tools.

Figure 2:
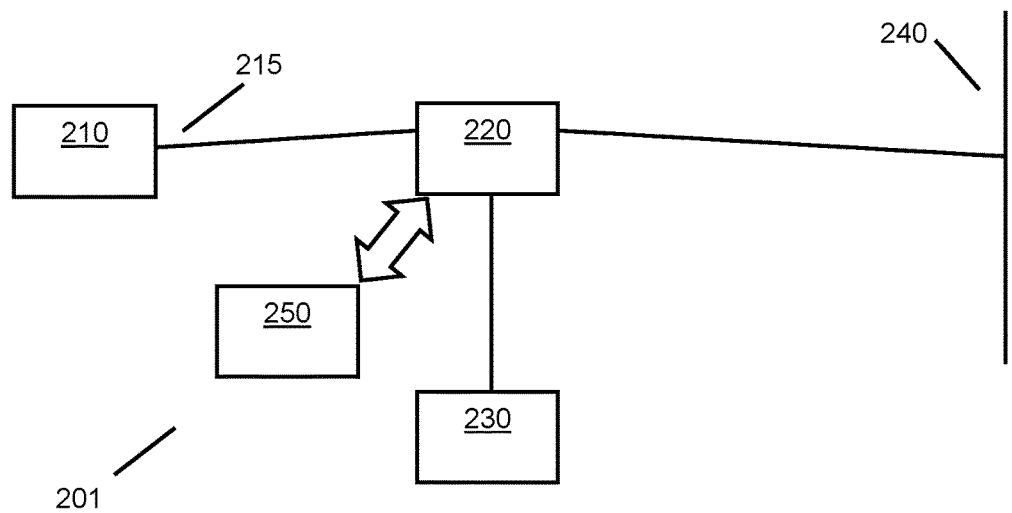
FIG. 2 illustrates a generalized a generalized block diagram of a system for scanning a semiconductor specimen.

Attention is now drawn to FIG. 2, which depicts a non-limitative example of a structure of a system 201 for scanning a semiconductor specimen 240. According to some embodiments, system 201 is a possible implementation of the examination tool 101 mentioned above.

System 201 includes a light source 210 producing an illumination beam 215. System 201 includes a scanner 220 optically connected to the light source 210. According to some embodiments, the scanner 220 can expand and redirect the illumination beam 215. As explained hereinafter, the scanner 220 includes a plurality of optical devices. System 201 further includes at least one light detector 230 configured to detect light resulted from scanning at least part of the specimen 240. System 201 further includes, and/or can communicate with a processor and memory circuitry (PMC) 250. PMC 250 is operatively connected to the scanner 220.

According to some embodiments, system 201 can include one or more lenses located between the scanner 220 and the specimen 240. According to some embodiments, system 201 can include a polarizing beam splitter located between the scanner 220 and the specimen 240, or within the scanner 220. The polarizing beam splitter can include a semi-transparent reflection plane which either transmits or reflects light incident thereupon, depending on the state of polarization of the incident light. According to some embodiments, system 201 includes a plurality of light detectors 230, and in particular, a bright-field detector (configured to detect reflected light which is closer to a central axis) and a gray-field detector (configured to detect reflected light which is farther from the central axis).

Figure 2A:
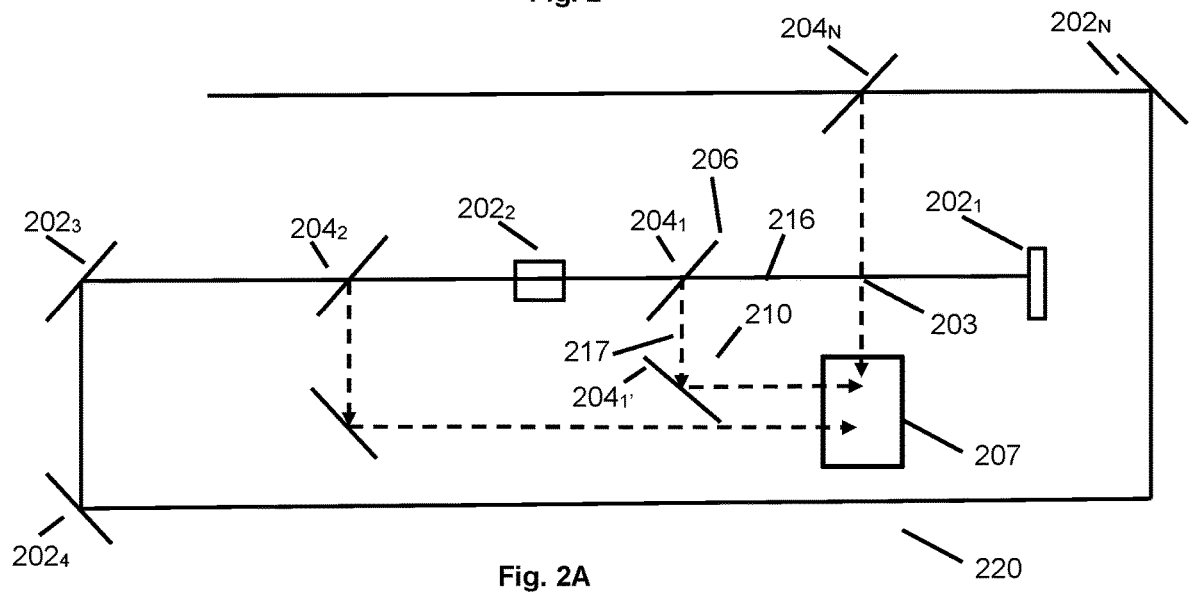
FIG. 2A illustrates a generalized a generalized block diagram of a scanner which can be part of the system of FIG. 2.

Attention is now drawn to FIG. 2A, which depicts elements that can be part of the scanner 220. As shown, scanner 220 includes a plurality of optical devices $202_1$, $202_2$, $202_3$, $202_4$, ..., $202_N$. In a scanning mode, a given optical device $202_i$ is configured to transmit light along an optical path towards another optical device $202_{i+1}$ (as explained hereinafter, the optical path between the optical device $202_i$ and the other optical device $202_{i+1}$ can include additional optical devices/elements). For example, in a scanning mode, the optical device $202_1$ is configured to transmit light towards the optical device $202_2$, along optical path 216. Scanner 220 further includes one or more optical elements $204_1$, $204_2$, ..., $204_N$. In particular, for each of a plurality of optical devices $202_i$, an optical element $204_i$ can be located on the optical path between the optical device $202_i$ and the next optical device $202_{i+1}$. During scanning of the specimen, the optical element $204_i$ allows transmission of light between the optical device $202_i$ the next optical device $202_{i+1}$. Transmission of light by the optical element $204_i$ can be controlled by PMC 250.

Examples of optical devices that can be located in the scanner 220 include e.g. (this list is not limitative):
a beam expander (which can in particular expand and/or polarize light);
a beam shaper (which can in particular shape light into a beam);
a phase corrector (which can in particular correct phase of the light in order to concentrate light in flat direction);
a beam divider (which can in particular divide light into a plurality of beams);
a beam collector (which can in particular collect a plurality of beams in order to create a unified beam).

Optical devices which can be used to perform these operations can include e.g. mirrors, prisms, lenses, etc.

Examples of optical elements $204_i$ includes e.g. mirrors, periscopes, etc. which can be in particular electro-mechanically controlled by a motor, upon sending of a command by PMC 250.

Scanner 220 further includes at least one imaging sensor 207 (in some embodiments, scanner 220 includes a plurality of imaging sensors 207). In some embodiments, the imaging sensor 207 is located outside the scanner 220.

Figure 3:
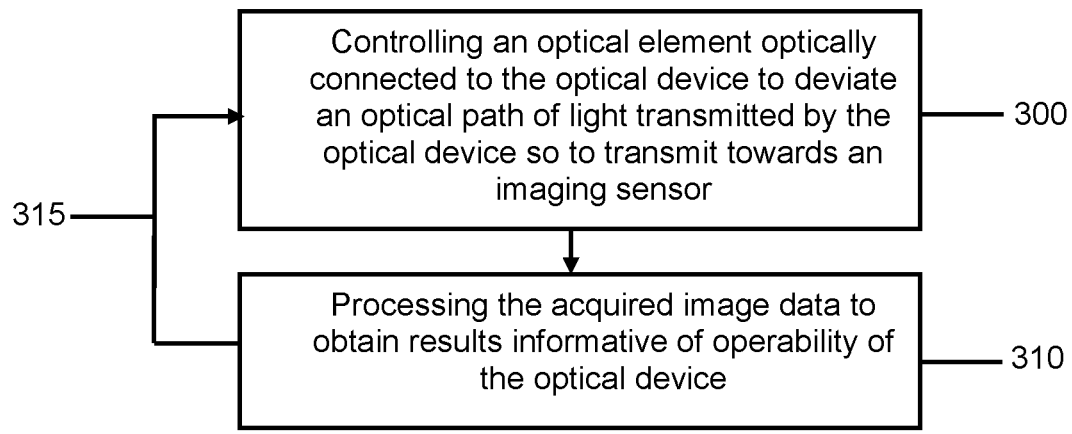
FIG. 3 illustrates a generalized flow-chart of a method of testing an optical device of a scanner.

Attention is now drawn to FIG. 3.

Assume that it is desired to test an optical device in a scanner for scanning a semiconductor specimen. For example, it can be desired to test an optical device $202_i$ in a scanner 220. This is however not limitative and the method applies to other kinds of optical devices and/or to other kinds of scanners.

The method includes controlling (operation 300), by a processor and memory circuitry (PMC) operatively connected to the scanner (such as PMC 250), an optical element optically connected to the optical device to deviate an optical path of light transmitted by the optical device so to transmit towards an imaging sensor. In particular, in a scanning mode, the optical device transmits light along a given optical path (e.g. towards another optical device of the scanner), and the optical element enables this light transmission. During a test mode, the optical element is controlled to deviate the optical path of light transmitted by the optical device to be tested, so to transmit towards an imagining sensor. This can include e.g. controlling an orientation of the optical element using a motor operatively connected to the optical element, by sending a command to the motor via the PMC 250.

The method further includes processing (operation 310) the acquired image data to obtain results informative of operability of the optical device. In particular, the image data can reflect optical transmission capability of the optical device, which is a key factor of the operability of the optical device.

In the example of FIG. 2A, assume that it is desired to test optical device $202_1$ of scanner 220. In a scanning mode, the optical device $202_1$ transmits light towards another optical device $202_2$ of the scanner 220 along optical path 216, and the optical element $204_1$ optically connected to the optical device $202_1$ enables light transmission along this optical path 216. In a test mode (such as in operation 300), the optical element $204_1$ is controlled (e.g. by PMC 250) to deviate the optical path of light transmitted by the optical device $202_1$ so to transmit along a second optical path comprising the at least one imaging sensor 207. This is illustrated in FIG. 2A, in which, during a test mode, the optical device $202_1$ does not transmit along the optical path 216 towards the next optical device $202_2$, but the optical element $204_1$ deviates light along a second optical path 217 which includes imaging sensor 207. In this non-limitative example, the second optical path 207 includes an additional optical element $204_{1'}$, but this is not limitative, and the optical element $204_1$ can deviate light directly towards the imaging sensor 207.

Figure 3A:
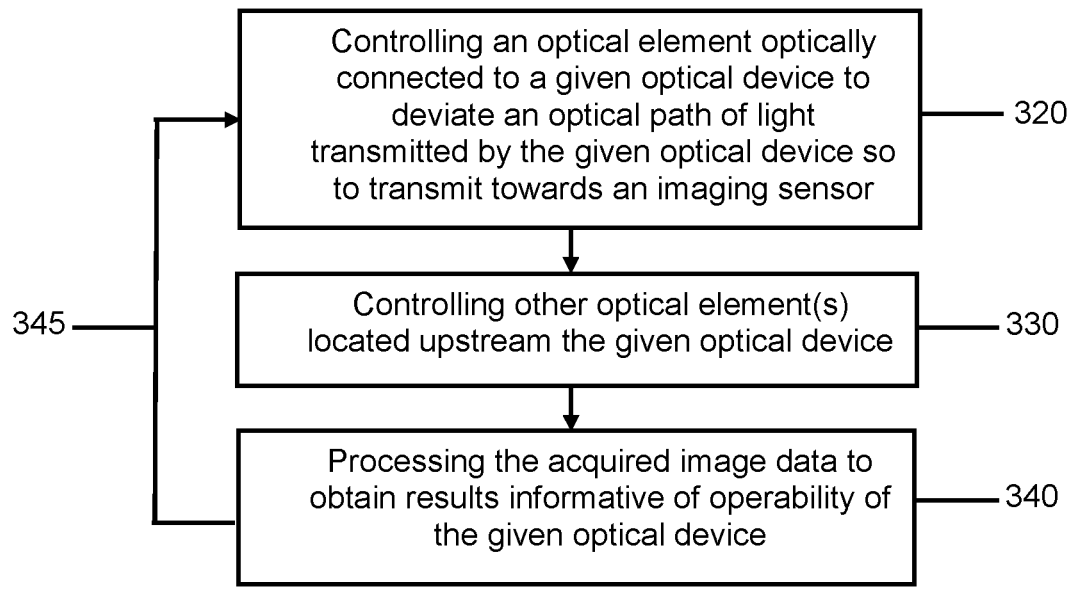
FIG. 3A illustrates a generalized flow-chart of a method of testing a given optical device among a plurality of optical devices of a scanner.

Attention is now drawn to FIG. 3A.

Assume that a given optical device (e.g. of a scanner for scanning a semiconductor specimen, such as scanner 220) has to be tested. Assume that the scanner includes a plurality of pairs, each pair including an optical device configured, in a scanning mode, to transmit light along an optical path towards another optical device of the scanner, and at least one optical element optically connected to the optical device and capable to deviate an optical path of light transmitted by the optical device. Assume that the given optical device belongs to a given pair.

The method can include (operation 320) controlling (in particular using a PMC, such as PMC 250) the optical element belonging to the given pair of the given optical device, to deviate the optical path of light transmitted by the given optical device so to transmit along a second optical path comprising at least one imaging sensor. In other words, When testing the given optical device, light reaching the given optical device can pass through one or more optical devices/optical elements located upstream (according to the optical path of the scanner) the given optical device under test.

Therefore, during test of the given optical device, the method can include controlling (operation 330), for each of one or more other pairs (each including an optical device and an associated optical element), an optical element of the other pair. The optical element of the other pair is located upstream the given optical device, and it is controlled to allow transmission of light of an optical device of the other pair along an optical path towards another optical device of the scanner (as in a regular scanning mode).

The method of FIG. 3A further includes processing (operation 330) the acquired image data to obtain results informative of operability of the optical device of the given pair.

Figure 3B:
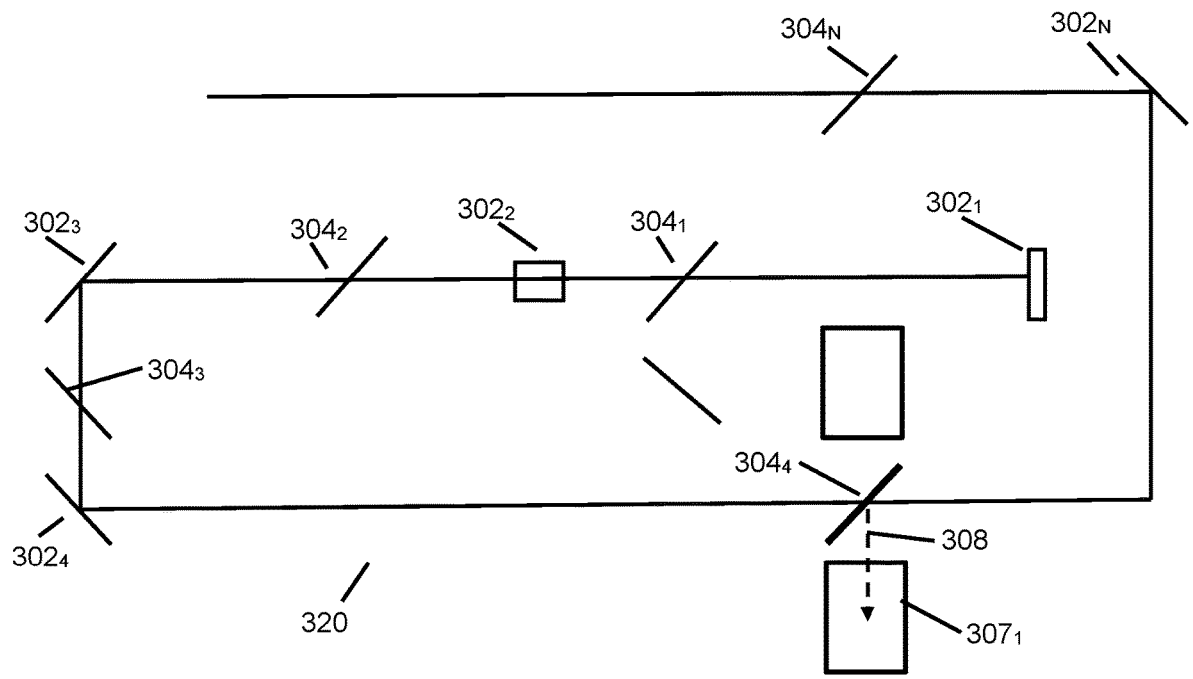
FIG. 3B illustrates a non-limitative example of the method of FIG. 3A.

A non-limitative example of the method of FIG. 3A is illustrated in FIG. 3B. Assume that it is intended to test optical device $302_4$ in a scanner 320 including optical devices $302_1$, $302_2$, $302_3$, $304_4$, . . . , $302_N$. Each optical device is associated with an optical element $304_1$, $304_2$, $304_3$, $304_4$, . . . , $304_N$, which enables, in a scanning mode, transmission of light along an optical path towards another optical device of the scanner. In order to test optical device $302_4$, the method includes controlling optical element $304_4$ to deviate light transmitted by optical device $302_4$ along a different optical path 308, towards imaging sensor $307_1$ of the scanner. Therefore, instead of transmitting light towards the next optical device $302_N$, light is deviated towards imaging sensor $307_1$. In addition, all optical elements (in this example $302_1$, $302_2$ and $302_3$) located upwards the optical device $302_4$ under test are controlled to allow transmission of light as in a regular scanning mode. In particular, optical element $304_1$ is controlled to allow transmission of light between optical device $302_4$ and optical device $302_2$, optical element $304_2$ is controlled to allow transmission of light between optical device $302_2$ and optical device $302_3$ and optical element $304_3$ is controlled to allow transmission of light between optical device $302_3$ and optical device $302_4$.

When the method of FIG. 3 (respectively FIG. 3A) is applied to scanner 220 (respectively 320), it can rely on existing elements of the scanner 220 (respectively 320). In particular, the optical element $204_i$ (respectively $304_i$) and/or the imaging sensor 207 (respectively $307_1$) can be existing components of the scanner 220 (respectively 320), which are used according to the new approach of FIG. 3, thereby ensuring efficient test optical device(s) of the scanner 220 (respectively 320).

According to some embodiments, an optical device can be tested at a plurality of different periods of time (e.g. during a periodical inspection, for example once a week, every two weeks, once a month, depending on the usage of the system including the optical device). This is shown in FIG. 3 (see reference 315) and FIG. 3A (see reference 345). As a consequence, a plurality of image data can be obtained.

In order to ensure the tests to be comparable, the method can include maintaining one or more optical parameters constant for the plurality of tests. In particular, optical parameters of the system 201 (examination tool) can be maintained during the plurality of tests, such as attenuation parameters of the light source 210 (light source 210 is generally associated with one or more attenuators which can be controlled by a PMC), or other optical parameters. This can be performed e.g. by a PMC which controls system 201.

Figure 4:
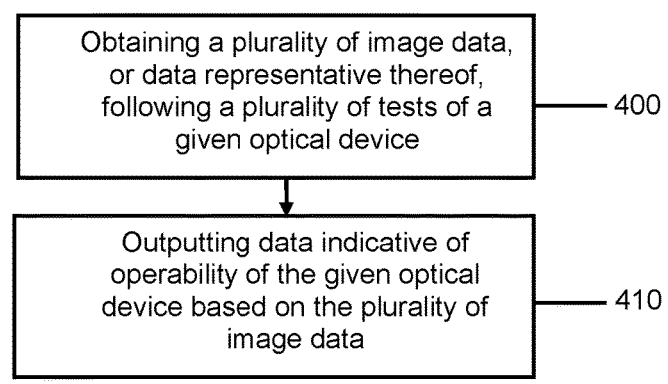
FIG. 4 illustrates a generalized flow-chart of a method of determining operability of an optical device based on a plurality of tests.

Attention is now drawn to FIG. 4. Assume that a given optical device has been tested as explained in the various embodiments above, at a plurality of different periods of time. As a consequence, a plurality of image data (or data representative thereof) have been obtained (reference 400), each image data corresponding to a different period of time.

The method can include outputting (reference 410) data indicative of operability of the given optical device based on the plurality of image data (or data representative thereof).

Operation 410 can include e.g. comparing image data (or data representative thereof) acquired at a given period of time with image data acquired at previous periods of time. This allows monitoring evolution of image data (or data representative thereof) over time. The method can include outputting data indicative of operability of the given optical device based at least on a matching of the evolution with an operability criterion.

In particular, relative increase or decrease of image data (or data representative thereof), and/or absolute value of image data (or data representative thereof) can be monitored to detect whether the given optical device is operative.

In a non-limitative example, image data include data informative of the grey level ($D_{grey}$) of the image. Data informative of the grey level of an image can be measured using tools such as Matlab (this not limitative). Data informative of the grey level of the image can include e.g. average pixel intensity of the image, and/or RMS (root mean square) value of the image and/or center of mass of the image, etc. Center of mass of the image reflects in particular ability of the optical device to focus light on a given zone. These examples are not limitative and according to some embodiments, other parameters of the image acquired during test of an optical device can be monitored (e.g. by monitoring their relative evolution over time with respect to an operability criterion, and/or by monitoring their absolute value with respect to a threshold).

If $D_{grey}$ measured for a given optical device decreases by a rate which is above a threshold (which corresponds to the operability criterion as mentioned above) for a given period of time, then the method can output that the given optical device is faulty. For example, the threshold can be equal to 2% per month (this is not limitative).

According to some embodiments, the absolute value of the $D_{grey}$ can be compared to a threshold, and if this absolute value is below the threshold, the optical device is considered as faulty.

According to some embodiments, the degradation rate of $D_{grey}$ of the image is monitored over time with respect to a threshold, together with the absolute value of $D_{grey}$ of the image.

Figure 5:
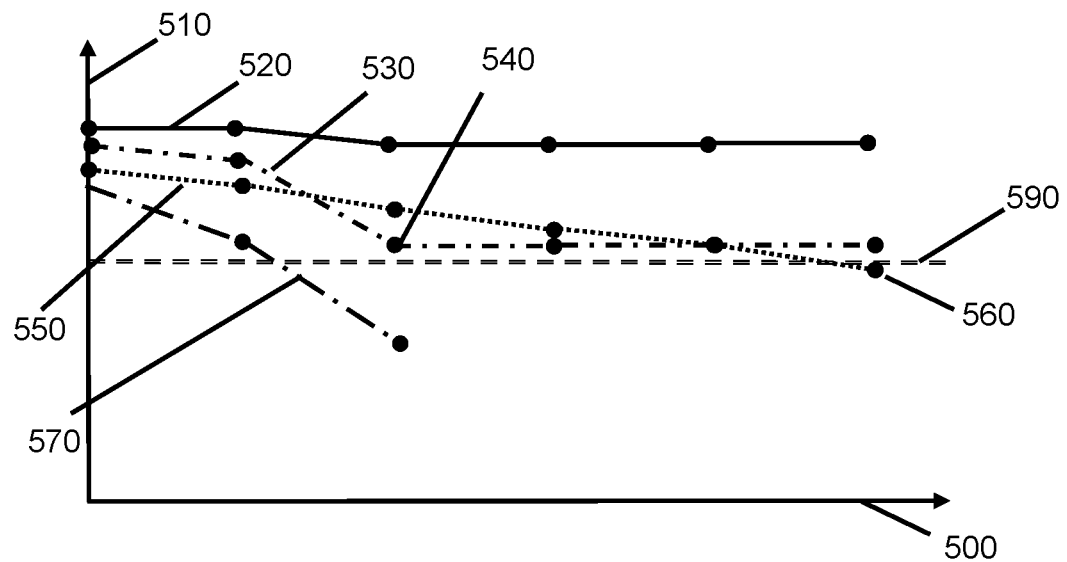
FIG. 5 illustrates a non-limitative examples of data than can be analyzed in the method of FIG. 4.

A non-limitative example is provided in FIG. 5, which illustrates evolution of data informative of grey level (axis 510) of images acquired over time (axis 500, e.g. a test is performed every month) for a plurality of different optical devices. Data informative of grey level can be obtained using the various methods described above.

Curve 520 shows that the data informative of grey level obtained for images associated with a first optical device has a degradation rate which is below the threshold (e.g. 2% per month), and that the absolute value of the data informative of grey level remains always above a threshold 590. The first optical device can be therefore considered as operative.

Curve 530 shows that, at the third test 540, data informative of grey level obtained for a second optical device has a degradation rate which is above the threshold (e.g. 2% per month). However, the absolute value of the data informative of grey level obtained for this second optical devices remains above the threshold 590. In this case, the method can output that this second optical device is at this stage operative, but can that there is serious prospects that it will need to be replaced in a next future. As explained hereinafter, in some embodiments, a prediction of the life cycle can be provided, based e.g. on past data collected for various optical devices, from which it is possible to generate a prediction.

Curve 550 shows that, at the sixth test 560, data informative of grey level obtained for a third optical device is below the threshold 590. Therefore, although the degradation rate of data informative of grey level obtained for this third optical device remains below the threshold (e.g. 2% per month), the third optical device is considered as faulty.

Curve 570 shows that, at a second test of a fourth optical device, the degradation rate of data informative of grey level is already above the threshold, and that at its third test the absolute value of data informative of grey level is below the threshold 530. Therefore, the fourth optical device is considered as faulty.

According to some embodiments, an interface can output to a user data informative of operability of each device, based e.g. on a visual representation relying on different colors (e.g. warm colors for faulty devices which need to be replaced immediately, cold colors for operative devices, and intermediate colors for devices which are currently operative but require a soon replacement). In some embodiments, the interface can output evolution of image data over time.

Figure 6:
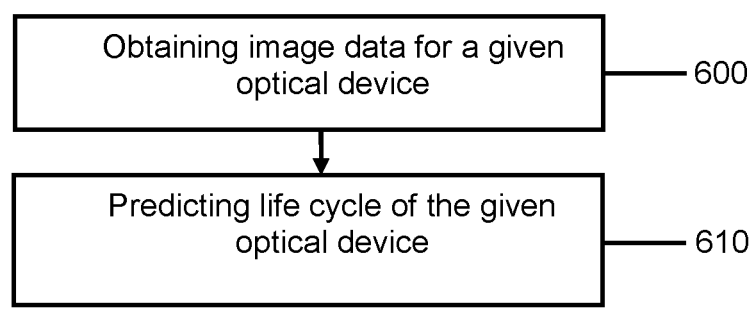
FIG. 6 illustrates a generalized flow-chart of a method of predicting life cycle of an optical device.

Attentions is now drawn to FIG. 6. According to some embodiments, a method can include collecting, in a database (stored e.g. in a memory), image data, or data representative thereof, obtained during a plurality of tests of one or more optical devices. According to some embodiments, the database can be used to perform various monitoring tasks and/or prediction tasks, such as predicting a life cycle of an optical device.

In some embodiments, a machine learning algorithm (such as a DNN, see e.g. DNN 112) is trained to predict life cycle of an optical device. Training can include feeding image data (e.g. data informative of grey level, or other data) of the database, together with a label indicative of life cycle of the optical device (the label is obtained based e.g. on true experiments). The machine learning algorithm is therefore trained to predict life cycle of an optical device based on image data, or data representative thereof, fed to the machine learning algorithm.

In a prediction phase, the machine learning algorithm is fed with image data (operation 600), or data representative thereof, obtained during one or more tests of a given optical device (in particular during a plurality of tests performed at different periods of time), and provides a prediction (operation 610) regarding life cycle of the given optical device.

The database can be used for various other purposes, such as statistical analysis of performance per optical device, statistical analysis of performance of the system including the optical devices, etc.

It is to be understood that the invention is not limited in its application to the details set forth in the description contained herein or illustrated in the drawings.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. A system for testing an optical device in a scanner for scanning a semiconductor specimen, the system comprising:
   a light source producing an illuminating beam;
   a scanner optically connected to the light source and comprising:
      a plurality of optical devices including a first optical device, wherein the first optical device is configured, in a scanning mode, to transmit light along an optical path towards a second optical device;
      at least one optical element optically connected to the first optical device and capable of deviating the optical path of light transmitted by the first optical device; and
      at least one imaging sensor;
   at least one light detector configured to detect light resulted from scanning at least part of the semiconductor specimen; and
   a processor and memory circuitry (PMC) operatively connected to the scanner and configured, in a test mode of at least the first optical device in which the system does not scan any semiconductor specimen, to:
      control the at least one optical element to deviate the optical path of light transmitted by the first optical device to transmit along a second optical path comprising the at least one imaging sensor, instead of transmitting towards the second optical device, thereby enabling acquiring, by the at least one imaging sensor, image data informative of the first optical device, wherein light deflected by the at least one optical element along the second optical path to reach the at least one imaging sensor in the test mode had not been reflected by any semiconductor specimen; and
      process the image data to obtain results informative of operability of the first optical device.

2. The system of claim 1, wherein the scanner comprises:
   a plurality of pairs, each pair including:
      an optical device configured, in a scanning mode, to transmit light along an optical path towards another optical device of the scanner; and
      at least one optical element optically connected to the optical device and capable to deviate an optical path of light transmitted by the optical device;
   wherein the PMC is further configured, during testing of an optical device of a given pair of the plurality of pairs, to:
      control at least one optical element of the given pair to deviate the optical path of light transmitted by the optical device of the pair so to transmit along a second optical path comprising the at least one imaging sensor, thereby enabling acquiring, by the at least one imaging sensor, image data informative of the optical device of the given pair; and
      process the image data to obtain results informative of operability of the optical device of the given pair.

3. The system of claim 2, wherein the PMC is further configured to, during the testing of the optical device of the given pair, control, for each other pair of one or more other pairs of the plurality of pairs, one or more optical elements of the other pair, wherein the one or more optical elements of the other pair are located upstream the optical device of the given pair along an optical path of the scanner, to allow transmission of light of an optical device of the other pair along an optical path towards another optical device of the scanner.

4. The system of claim 1, wherein the plurality of optical devices of the scanner includes at least one of a beam expander, a beam shaper, a beam polarizer, a phase corrector, a beam divider, and a beam collector.

5. The system of claim 1, wherein the PMC is further configured to:
   obtain, for the first optical device, a plurality of image data, or data representative thereof, acquired based on a plurality of tests of the first optical device performed at different periods of time; and
   output data indicative of operability of the first optical device based on the plurality of image data or data representative thereof.

6. The system of claim 1, wherein the PMC is further configured to predict, based on a plurality of image data acquired during a plurality of tests of the first optical device, or data representative thereof, a life cycle of the first optical device.

7. The system of claim 5, wherein the PMC is further configured to monitor an evolution of the plurality of image data, or data representative thereof, over the different periods of time, and to output data indicative of operability of the first optical device based at least on a matching of the evolution with an operability criterion.

8. The system of claim 1, wherein the PMC is further configured to, during performing a plurality of tests of the first optical device at different periods of time, maintain one or more optical parameters constant for the plurality of tests.

9. The system of claim 1, wherein the PMC is further configured to determine data informative of grey level ($D_{grey}$) based on the image data, and to output data indicative of operability of the first optical device based on $D_{grey}$.

10. The system of claim 2, further comprising an interface configured to output, for each optical device that has been tested, data informative of an operability of the optical device.

11. A method of testing an optical device in a scanner for scanning a semiconductor specimen, the method comprising:
   controlling, by a processor and memory circuitry (PMC) operatively connected to the scanner, an optical element optically connected to the optical device to deviate an optical path of light transmitted by the optical device to transmit along a second optical path towards an imaging sensor, thereby enabling acquiring, by the imaging sensor, image data informative of the optical device, wherein, in a scanning mode, the optical element enables light transmitting from the optical device towards another optical device comprised in the scanner, and wherein light deflected by the optical element along the second optical path to reach the at least one imaging sensor in the testing of the optical device had not been reflected by any semiconductor specimen; and
   processing, by the PMC, the image data to obtain results informative of operability of the optical device.

12. The method of claim 11, wherein the scanner comprises:
   a plurality of pairs, each pair including:
      an optical device configured, in a scanning mode, to transmit light along an optical path towards another optical device of the scanner; and
      at least one optical element optically connected to the optical device and capable to deviate an optical path of light transmitted by the optical device; and wherein the method further comprises, during testing of an optical device of a given pair of the plurality of pairs, by the PMC:

controlling at least one optical element of the given pair to deviate the optical path of light transmitted by the optical device of the pair so to transmit along a second optical path comprising the at least one imaging sensor, thereby enabling acquiring, by the at least one imaging sensor, image data informative of the optical device of the given pair; and processing the image data to obtain results informative of operability of the optical device of the given pair.

13. The method of claim 12, further comprising, by the PMC, during the testing of the optical device of the given pair, controlling, for each other pair of one or more other pairs of the plurality of pairs, one or more optical elements of the other pair, located upstream the optical device of the given pair along an optical path of the scanner, to allow transmission of light of an optical device of the other pair along an optical path towards another optical device of the scanner.

14. The method of claim 11, further comprising:

obtaining, by the PMC for the first optical device, a plurality of image data, or data representative thereof, acquired based on a plurality of tests of the first optical device performed at different periods of time; and outputting, by the PMC, data indicative of operability of the first optical device based on the plurality of image data or data representative thereof.

15. The method of claim 11, further comprising predicting, by the PMC based on a plurality of image data acquired during a plurality of tests of the first optical device, or data representative thereof, a life cycle of the first optical device.

16. The method of claim 14, further comprising monitoring, by the PMC, an evolution of the plurality of image data, or data representative thereof, over the different periods of time, and outputting data indicative of operability of the first optical device based at least on a matching of the evolution with an operability criterion.

17. The method of claim 11, further comprising, during performing a plurality of tests of the first optical device at different periods of time, maintaining, by the PMC, one or more optical parameters constant for the plurality of tests.

18. The method of claim 11, further comprising determining, by the PMC, data informative of grey level ($D_{grey}$) based on the image data, and outputting data indicative of operability of the first optical device based on $D_{grey}$.

19. The method of claim 12, further comprising outputting, by the PMC on an interface, for each optical device that has been tested, data informative of an operability of the optical device.

20. A non-transitory computer readable medium comprising instructions that, when executed by a processor and memory circuitry (PMC), cause the PMC to perform testing of an optical device in a scanner for scanning a semiconductor specimen, the testing comprising operations comprising:

controlling an optical element optically connected to the optical device to deviate an optical path of light transmitted by the optical device to transmit along a second optical path towards an imaging sensor, thereby enabling acquiring, by the imaging sensor, image data informative of the optical device, wherein in a scanning mode the optical element enables light transmitting from the optical device towards another optical device comprised in the scanner, and wherein light deflected by the optical element along the second optical path to reach the at least one imaging sensor in the testing of the optical device had not been reflected by any semiconductor specimen; and processing the image data to obtain results informative of operability of the optical device.

* * * * *